US010204955B2

United States Patent
Hamada et al.

(10) Patent No.: US 10,204,955 B2
(45) Date of Patent: Feb. 12, 2019

(54) BACK ILLUMINATED PHOTO DETECTOR AND OPTICAL RECEIVER MODULE HAVING A CENTER PORTION OF AN EXPOSED CONTACT PORTION LOCATED ON AN OPTICAL AXIS OF LIGHT

(71) Applicant: Oclaro Japan, Inc., Sagamihara, Kanagawa (JP)

(72) Inventors: Hiroshi Hamada, Kanagawa (JP); Takashi Toyonaka, Kanagawa (JP)

(73) Assignee: Oclaro Japan, Inc., Kanagawa (JP)

( * ) Notice: Subject to any disclaimer, the term of this patent is extended or adjusted under 35 U.S.C. 154(b) by 104 days.

(21) Appl. No.: 15/493,175

(22) Filed: Apr. 21, 2017

(65) Prior Publication Data
US 2017/0309658 A1  Oct. 26, 2017

(30) Foreign Application Priority Data
Apr. 25, 2016  (JP) ................................. 2016-087023

(51) Int. Cl.
*H01L 27/146* (2006.01)
*G02B 6/32* (2006.01)
*G02B 6/42* (2006.01)

(52) U.S. Cl.
CPC ............ *H01L 27/1464* (2013.01); *G02B 6/32* (2013.01); *G02B 6/4295* (2013.01); *H01L 27/14607* (2013.01); *H01L 27/14618* (2013.01); *H01L 27/14636* (2013.01); *G02B 6/4225* (2013.01)

(58) Field of Classification Search
CPC ...... G02B 6/32; G02B 6/4225; G02B 6/4295; H01L 27/14607; H01L 27/1464
USPC .............................................. 250/214.1, 239
See application file for complete search history.

(56) References Cited

U.S. PATENT DOCUMENTS 6,690,079 B2 * 2/2004 Fujimura .............. H01L 31/103
257/228
2011/0233708 A1   9/2011 Washino et al.

FOREIGN PATENT DOCUMENTS

| EP | 0552792 A1 | 7/1993 |
| JP | 05-224101 A | 9/1993 |
| JP | 2004-200202 A | 7/2004 |
| JP | 2011-210866 A | 10/2011 |

* cited by examiner

Primary Examiner — Que T Le
(74) Attorney, Agent, or Firm — Mattingly & Malur, PC (57) ABSTRACT

Provided is a back illuminated photo detector enabling easy determination of whether or not the radius of a beam spot on a light absorption layer is an appropriate size. The back illuminated photo detector includes: a semiconductor substrate having a first surface for receiving light; a semiconductor layer that is laminated on a second surface and includes a light absorption layer; a passivation film so as to expose a contact portion that is part of an upper surface of the semiconductor layer; and an electrode that is in contact with the semiconductor layer in the contact portion, and has a reflectance lower than that of the passivation film. The contact portion includes a center portion located on an optical axis, and an area of the center portion is smaller than a design cross-sectional area of a beam spot.

6 Claims, 8 Drawing Sheets

BACK ILLUMINATED PHOTO DETECTOR AND OPTICAL RECEIVER MODULE HAVING A CENTER PORTION OF AN EXPOSED CONTACT PORTION LOCATED ON AN OPTICAL AXIS OF LIGHT

CROSS-REFERENCE TO RELATED APPLICATION

The present application claims priority from Japanese application JP 2016-087023, filed on Apr. 25, 2016, the content of which is hereby incorporated by reference into this application.

BACKGROUND OF THE INVENTION

1. Field of the Invention

The present invention relates to a back illuminated photo detector and an optical receiver module including the back illuminated photo detector.

2. Description of the Related Art

Photo detectors that include a plurality of semiconductor layers including a light absorption layer and being laminated on a semiconductor substrate, and are configured to absorb light entering the photo detectors from the semiconductor substrate side by the light absorption layer may be called "back illuminated photo detectors." In the back illuminated photo detector, in order to enhance the light receiving efficiency of the back illuminated photo detector, an electrode may be arranged so as to cover the plurality of semiconductor layers so that light that is not absorbed by the light absorption layer may be reflected by the electrode. Further, the back illuminated photo detector may be mounted on an optical receiver module together with other optical members. Optical receiver modules may be called "receiver optical subassemblies (ROSAs)."

In JP 2004-200202 A, there is disclosed a semiconductor photo detector including a ring-shaped contact electrode provided on the surface of a semiconductor layer that corresponds to the outermost surface of a light receiving portion.

In JP 2011-210866A, there is described a semiconductor photo detector including: a reflection film that covers the upper surface portion of a semiconductor layer and has a principal reflection region; and an upper electrode that extends through the reflection film and surrounds a portion of the circumference of the principal reflection region.

In JP H05-224101 A, there is disclosed a semiconductor light receiving device in which a focus position of a beam spot of light entering a semiconductor photo detector is shifted forward or backward.

SUMMARY OF THE INVENTION

A lens configured to condense light may be arranged in order that light entering a back illuminated photo detector focuses on a light absorption layer. As the radius of a beam spot on the light absorption layer is reduced, optical intensity per unit area is increased to increase a carrier generation amount. However, when the optical intensity per unit area is increased to reach a certain degree or more, the carrier generation amount is saturated, resulting in pile-up in which the latter part of successive optical signals is not detected.

The back illuminated photo detector may accordingly be mounted on a ROSA while the position of the lens is adjusted so that a beam spot has an appropriate radius on the light absorption layer. In order to measure the radius of a beam spot on the light absorption layer to determine whether the radius is appropriate or not, it is necessary to measure the high-frequency characteristics of the photo detector while changing the position of the lens. As a result, a cost is increased.

In view of the foregoing, the present invention has an object to provide a back illuminated photo detector enabling easy determination of whether or not the radius of a beam spot on a light absorption layer is an appropriate size.

(1) In order to solve the above-mentioned problem, a back illuminated photo detector according to one embodiment of the present invention includes: a semiconductor substrate having a first surface for receiving light; a semiconductor layer that is laminated on a second surface opposed to the first surface, and includes a light absorption layer configured to absorb the light; a passivation film formed on the semiconductor layer so as to expose a contact portion that is part of an upper surface of the semiconductor layer; and an electrode that is in contact with the semiconductor layer in the contact portion, and has a reflectance of the light lower than a reflectance of the light of the passivation film, the contact portion at least including a center portion located on an optical axis of the light, an area of the center portion being smaller than a design cross-sectional area of a beam spot of the light.

(2) In the back illuminated photo detector according to the item (1), an area of the upper surface of the semiconductor layer is larger than the design cross-sectional area of the beam spot of the light.

(3) In the back illuminated photo detector according to the item (1), the area of the center portion is equal to or smaller than 36% of an area of the upper surface of the semiconductor layer.

(4) In the back illuminated photo detector according to the item (1), the area of the center portion is equal to or larger than 1% of an area of the upper surface of the semiconductor layer.

(5) In the back illuminated photo detector according to the item (1), the contact portion includes a peripheral portion surrounding the center portion while being separated from the center portion.

(6) An optical receiver module includes: the back illuminated photo detector of any one of the items (1) to (5); a collective lens arranged on the first surface side of the back illuminated photo detector; and a package including the back illuminated photo detector and the collective lens.

According to the present invention, there is provided the back illuminated photo detector enabling easy determination of whether or not the radius of the beam spot on the light absorption layer is an appropriate size.

DETAILED DESCRIPTION OF THE INVENTION

Figure 8:
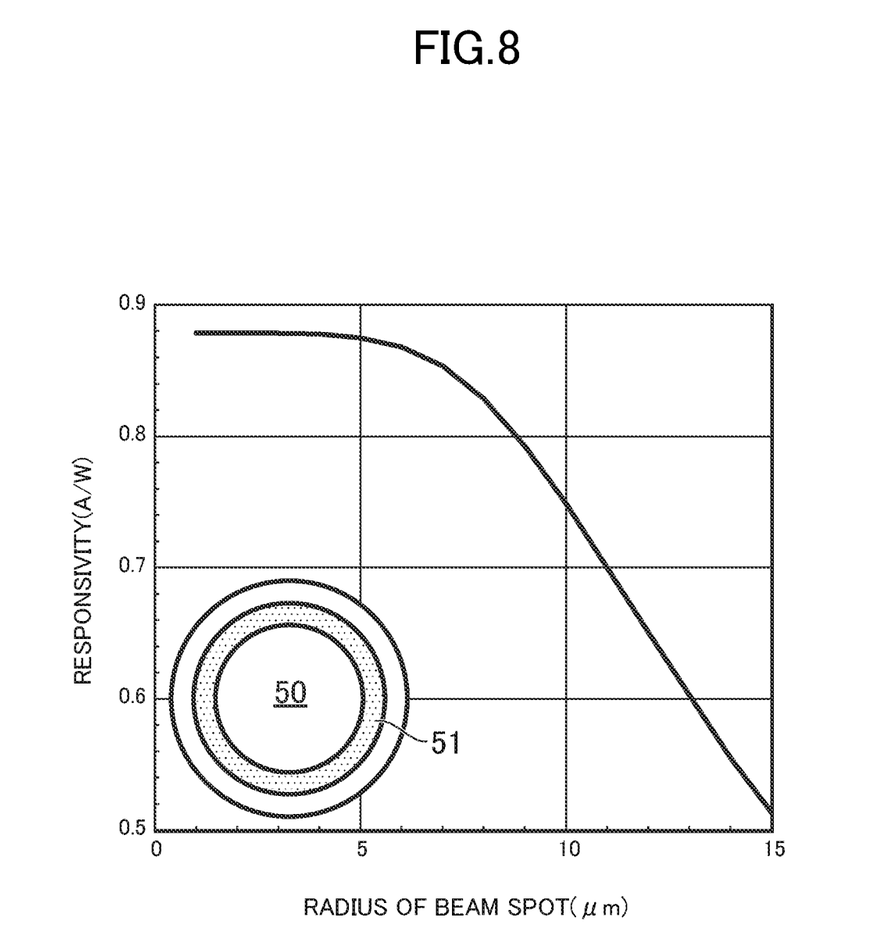
FIG. 8 is a graph for showing the relationship between the responsivity and the radius of a beam spot regarding a back illuminated photo detector according to the related art.

FIG. 8 is a graph for showing the relationship between the responsivity and the radius of a beam spot regarding a back illuminated photo detector according to the related art. In the graph, the vertical axis represents the responsivity (unit: A/W), and the horizontal axis represents the radius of a beam spot (unit: μm). Here, the responsivity is the ratio of the current value (unit: A) of photocurrent generated by light entering the back illuminated photo detector to the light amount (unit: W) of the incident light. Further, the radius of a beam spot is a radius with which optical intensity at a beam waist is $1/e^2$ of that at the center of the beam on the assumption that the incident light is a Gaussian beam.

The back illuminated photo detector according to the related art includes semiconductor layers including a light absorption layer configured to absorb light. The semiconductor layers have an upper surface 50, and a passivation film is formed on the upper surface 50 except for a contact portion 51. Further, an electrode is formed in the hatched contact portion 51. The electrode has a light reflectance lower than that of the passivation film. The upper surface 50 of the semiconductor layers has an outlined high-reflection region, and a hatched low-reflection region (contact portion 51). The passivation film is formed of an oxide film, and the electrode is formed of a metal film.

In the back illuminated photo detector according to the related art, responsivity is improved by adjusting the position of the lens so that the optical axis of incident light is located in the high-reflection region of the upper surface 50, thereby reflecting a larger amount of light to the light absorption layer side. Thus, when the radius of a beam spot is smaller than the inner diameter of the ring-shaped contact portion 51 (when the radius of the beam spot is smaller than 5 μm in this example), the responsivity is maximum irrespective of the radius of the beam spot. When the radius of the beam spot is increased until the radius of the beam spot becomes larger than the inner diameter of the ring-shaped contact portion 51 (when the radius of the beam spot becomes larger than 5 μm in this example), the light also enters the low-reflection region, with the result that the intensity of reflected light is reduced. In short, the responsivity is reduced as the radius of the beam spot is increased. When the radius of the beam spot is increased until the radius of the beam spot becomes even larger than the outer diameter of the upper surface 50 of the semiconductor layers, part of the light does not enter the semiconductor layers, and the intensity of the incident light is reduced. In short, the responsivity is reduced as the radius of the beam spot is increased.

It is required to reduce the radius of a beam spot in order to sufficiently increase the responsivity. However, pile-up may occur when the radius of the beam spot is reduced too much, and hence the radius of the beam spot needs to be adjusted to be a certain size. When the back illuminated photo detector according to the related art is mounted on a ROSA, the radius of a beam spot with which reduction in responsivity starts is checked, and then the radius of the beam spot is slightly reduced from the found radius. In this way, the radius of the beam spot is adjusted so that the responsivity may be sufficiently high and the pile-up may be prevented. Here, in order to determine whether the pile-up occurs or not, it is necessary to measure a high-frequency modulated optical signal entering the back illuminated photo detector. Consequently, such an adjustment process leads to increase in cost due to repetitive adjustment of the radius of a beam spot and measurement of high-frequency modulated optical signals. In view of the foregoing, the inventors of the present invention have conducted extensive research about adjustment of the radius of abeam spot on aback illuminated photo detector, thereby inventing a back illuminated photo detector enabling easy determination of whether or not the radius of a beam spot on a light absorption layer is an appropriate size. Now, embodiments of the present invention are described in detail.

Now, the embodiments of the present invention are specifically described in detail with reference to the attached drawings. Throughout the figures for illustrating the embodiments, like reference numerals are used to represent members having like functions, and description thereof is omitted for the sake of simplicity. The drawings referred to in the following are only for illustrating the embodiments by way of examples, and are not necessarily drawn to scale.

First Embodiment

Figure 1:
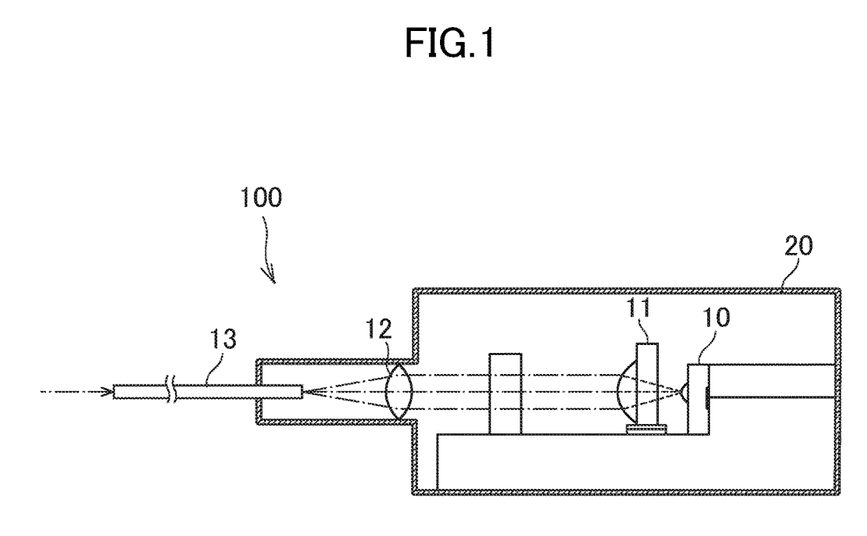
FIG. 1 is a cross-sectional view of a ROSA according to a first embodiment of the present invention.

FIG. 1 is a cross-sectional view of a ROSA 100 according to a first embodiment of the present invention. The ROSA 100 includes a back illuminated photo detector 10, a collective lens 11, a collimator lens 12, an optical fiber 13, and a package 20. The optical fiber 13 extends into the package 20 from outside the package 20 through the package 20, and guides signal light into the package 20. The collimator lens 12 collimates the signal light emitted from the optical fiber 13. The collective lens 11 condenses the collimated light onto the back illuminated photo detector 10. The back illuminated photo detector 10 is mounted on the ROSA 100 through the following procedures. (i) The back illuminated photo detector 10 is fixed at a predetermined position. (ii) Light is experimentally allowed to enter the package 20 from the optical fiber 13. (iii) The responsivity of the back illuminated photo detector 10 is measured while the position of the collective lens 11 is changed. (iv) The collective lens 11 is fixed at a position determined based on the measurement result. The structure of a ROSA for obtaining effects of the present invention, which are described later, is not limited to the structure described in the first embodiment. It is only necessary that the ROSA include the collective lens 11. The package may be a cylindrical can-type package, or the structure may not include the optical fiber.

Figure 2:
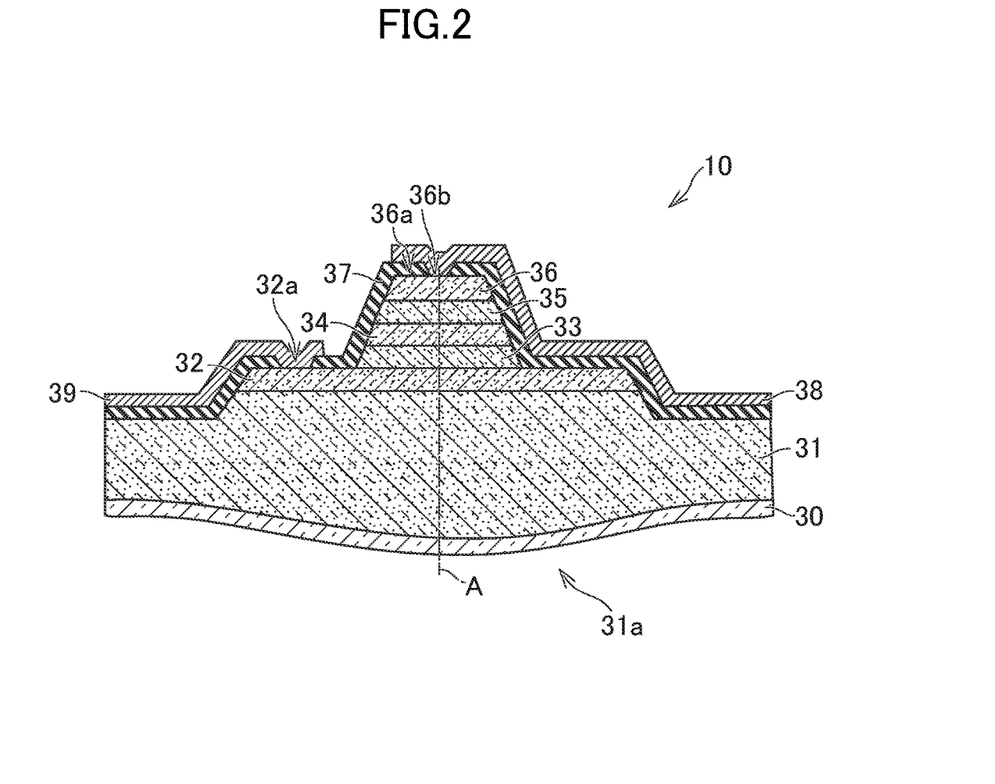
FIG. 2 is a cross-sectional view of aback illuminated photo detector according to the first embodiment of the present invention.

FIG. 2 is a cross-sectional view of the back illuminated photo detector 10 according to the first embodiment of the present invention. The back illuminated photo detector 10 includes a semiconductor substrate 31 having a first surface for receiving light (light condensed by the collective lens 11 arranged on the first surface side of the back illuminated photo detector 10; hereinafter referred to as "incident light"). Here, the first surface refers to a surface opposed to a side where a light absorption layer 34 is provided, that is, the rear surface of the semiconductor substrate 31. The semiconductor substrate 31 is formed of an Fe-doped InP substrate, for example. The first surface (rear surface) of the semiconductor substrate 31 has a convex lens 31*a* configured to condense the incident light. A low-reflection film 30 is provided on the first surface of the semiconductor substrate 31. The lens 31*a* may be omitted. Further, the package 20 includes the back illuminated photo detector 10 and the collective lens 11, but may include other components.

The back illuminated photo detector 10 includes semiconductor layers that include the light absorption layer 34 configured to absorb the incident light and are laminated on a second surface of the semiconductor substrate 31 that is opposed to the first surface. The semiconductor layers include an n-type contact layer provided on the second surface (front surface) of the semiconductor substrate 31, an n-type buffer layer 33 provided on the n-type contact layer 32, the light absorption layer 34 provided on the n-type buffer layer 33, a p-type buffer layer 35 provided on the light absorption layer 34, and a p-type contact layer 36 provided on the p-type buffer layer 35. The height of the semiconductor layers is, for example, about 1 μm, and each layer may be grown by, for example, molecular beam epitaxy.

The back illuminated photo detector 10 includes a passivation film 37 formed on the semiconductor layers so as to expose a contact portion 36*b* that is part of an upper surface 36*a* of the semiconductor layers. The upper surface 36*a* of the semiconductor layers is the upper surface of the p-type contact layer 36. The p-type contact layer 36 may have the substantially circular upper surface 36*a* having a radius of about 10 μm. That is, the area of the upper surface 36*a* may be about $100\pi$ (μm$^2$) ($\approx 314$ (μm$^2$)).

The back illuminated photo detector 10 includes a p-type electrode 38 that is in contact with the semiconductor layer in the contact portion 36*b* and has an incident light reflectance lower than that of the passivation film 37. Further, the back illuminated photo detector 10 includes an n-type electrode 39 in contact with the n-type contact layer 32 in the n-type electrode contact portion 32*a*. The p-type electrode 38 and the n-type electrode 39 may be made of metal.

The contact portion 36*b* at least includes a center portion located on an optical axis A of the incident light. In this example, the contact portion 36*b* only includes the center portion. A case where the contact portion 36*b* includes peripheral portions as well as the center portion is described in detail in a second embodiment of the present invention.

The area of the center portion of the contact portion 36*b* is smaller than the design cross-sectional area of the beam spot of the incident light. As an exemplary specific numerical value in the back illuminated photo detector 10 according to the first embodiment, the radius of the substantially circular center portion of the contact portion 36*b* is about 5 μm. That is, the area of the center portion of the contact portion 36*b* is about $25\pi$ (μm$^2$) ($\approx 78.5$ (μm$^2$)). Meanwhile, the design radius of the beam spot of the incident light is about 6 μm, and the cross-sectional area of the beam spot is about $36\pi$ (μm$^2$) ($\approx 113$ (μm$^2$)).

A distance from the light absorption layer 34 to the upper surface 36*a* is about several hundred nanometers, and hence the radius of the beam spot on the upper surface 36*a* and the radius of the beam spot on the light absorption layer 34 in the semiconductor layers are almost the same. Accordingly, in the following description, the radius of the beam spot on the upper surface 36*a* and the radius of the beam spot on the light absorption layer 34 in the semiconductor layers are regarded as being the same.

Figure 3:
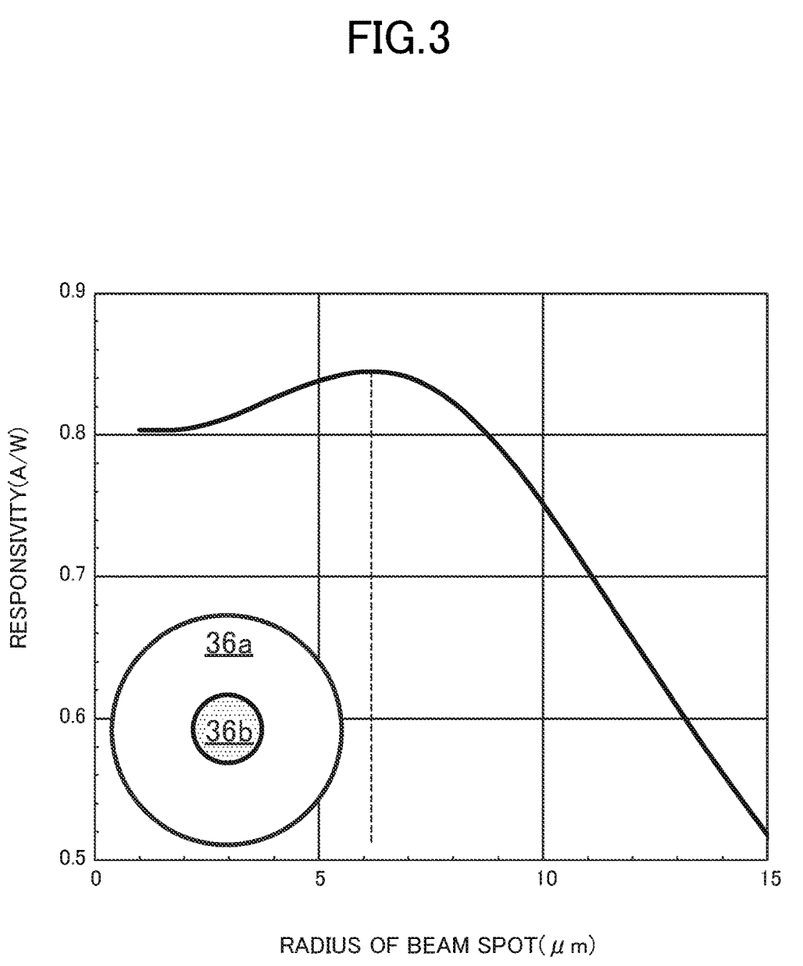
FIG. 3 is a graph for showing the relationship between the responsivity and the radius of a beam spot regarding the back illuminated photo detector according to the first embodiment of the present invention.

FIG. 3 is a graph for showing the relationship between the responsivity (unit: A/W) and the radius of a beam spot (unit: μm) regarding the back illuminated photo detector 10 according to the first embodiment of the present invention. In the graph, the vertical axis represents the responsivity (unit: A/W), and the horizontal axis represents the radius of a beam spot (unit: μm). In the lower left of the graph, the shape of the upper surface 36*a* of the semiconductor layers of the back illuminated photo detector 10 according to the first embodiment is outlined, and the shape of the contact portion 36*b* is hatched. The passivation film 37 is formed on the upper surface 36*a* except for the contact portion 36*b*, and the p-type electrode 38 is formed in the contact portion 36*b*. The light reflectance of the p-type electrode 38 is lower than the light reflectance of the passivation film 37. The upper surface 36*a* except for the contact portion 36*b* is the high-reflection region, and the contact portion 36*b* is the low-reflection region.

When the optical axis of the incident light is adjusted to be positioned on the center of the contact portion 36*b*, and the radius of the beam spot is reduced to approach zero, most of incident light that is not absorbed by the light absorption layer 34 is reflected by the contact portion 36*b*, which is the low-reflection region. When the radius of the beam spot is increased in such a state, part of the incident light is reflected by the contact portion 36*b*, which is the low-reflection region, and the remaining part is reflected by the upper surface 36*a*, which is the high-reflection region. Consequently, the responsivity is gradually increased as the radius of the beam spot is gradually increased from near zero. The radius of the beam spot, with which the responsivity is maximum, is about 6 μm, which is indicated by the broken line in the graph. It is conceivable that, when the radius of the beam spot is 6 μm, part of the incident light is reflected by the contact portion 36*b* having a radius of 5 μm, and the remaining part is reflected by the upper surface 36*a*. The responsivity is reduced as the radius of the beam spot is further increased. As the reason for this, the following is conceivable: when the radius of the beam spot becomes larger than the outer diameter of the upper surface 36*a* of the semiconductor layers, part of the light does not enter the semiconductor layers and the intensity of the incident light is reduced.

According to the back illuminated photo detector 10 of the first embodiment, because the area of the center portion of the contact portion 36*b* is smaller than the design cross-sectional area of the beam spot of the incident light, a peak appears in the responsivity when the radius of the beam spot is gradually increased from near zero. As a result, it is possible to recognize that the beam spot has an appropriate radius. Thus, according to the back illuminated photo detector 10 of the first embodiment, it is possible to easily determine whether or not the radius of the beam spot on the light absorption layer 34 is an appropriate size.

Also in the back illuminated photo detector according to the related art, a contact portion may be provided at the center of the upper surface of the semiconductor layers. However, in the related art, the area of the contact portion is usually increased as much as possible in order to reduce electric resistance between the electrode and the semiconductor layers. Further, in terms of reflecting, by a large amount, light that is not absorbed by the light absorption layer, the ring-shaped contact portion as illustrated in FIG. 8 is usually provided to increase the reflectance as much as possible. In the back illuminated photo detector 10 according to the first embodiment, the area of the center portion of the contact portion 36b is set to be smaller than the design cross-sectional area of the beam spot of the incident light so that the peak may appear in the responsivity. Such responsivity characteristics can be achieved by intentionally providing the contact portion 36b, which is the low-reflection region, at the position on the optical axis of the incident light, thereby setting the area of the contact portion 36b to be smaller than a desired cross-sectional area of the beam spot. Thus, such responsivity characteristics are obtained based on a design concept completely different from that of the back illuminated photo detector according to the related art.

The area of the upper surface 36a of the semiconductor layers of the back illuminated photo detector 10 according to the first embodiment is larger than the design cross-sectional area of the beam spot of the incident light. Specifically, the area of the upper surface 36a of the semiconductor layers is about $100\pi$ ($\mu m^2$), whereas the design cross-sectional area of the beam spot of the incident light is about $36\pi$ ($\mu m^2$). The design cross-sectional area of the beam spot of the incident light is larger than the area of the center portion of the contact portion 36b, and is smaller than the area of the upper surface 36a of the semiconductor layers. With this configuration, the peak appears in the responsivity when the radius of the beam spot is changed, and it is therefore possible to easily determine whether or not the radius of the beam spot on the light absorption layer 34 is an appropriate size.

Figure 4:
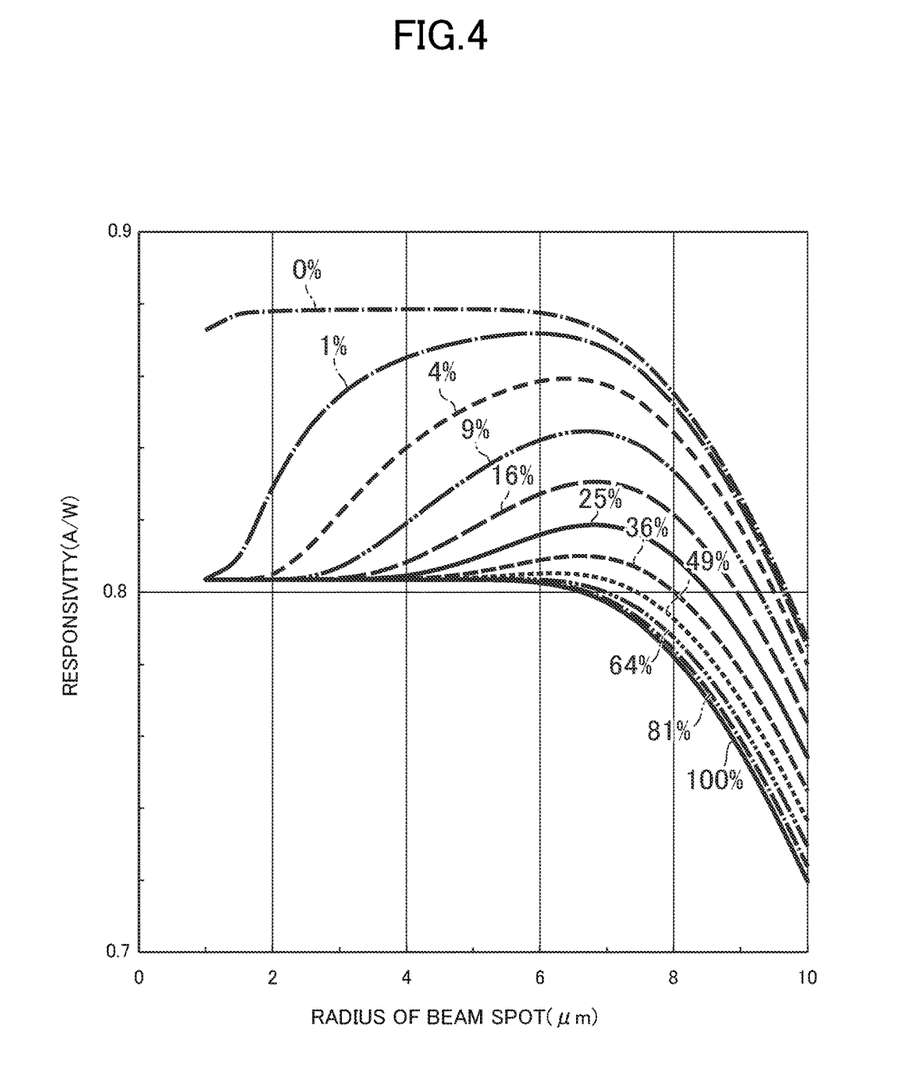
FIG. 4 is a graph for showing the relationship between the responsivity and the area of a contact portion regarding the back illuminated photo detector according to the first embodiment of the present invention.

FIG. 4 is a graph for showing the relationship between the responsivity and the area of the contact portion 36b regarding the back illuminated photo detector 10 according to the first embodiment of the present invention. In the graph of FIG. 4, the vertical axis represents the responsivity (unit: A/W), and the horizontal axis represents the radius of a beam spot (unit: µm). In FIG. 4, 11 different graphs for cases where the ratio of the area of the contact portion 36b to the area of the upper surface 36a is changed are shown.

When the ratio of the area of the contact portion 36b to the area of the upper surface 36a is 0% or 100%, the peak does not appear in the responsivity. When the radius of the beam spot is increased to be a certain size, part of the light fails to enter the semiconductor layers, and hence the responsivity is reduced. When the ratio of the area of the contact portion 36b is 0%, the incident light is reflected by the high-reflection region. Hence, the maximum value of the responsivity in this case is larger than that of the case where the ratio of the area of the contact portion 36b is 100% and the incident light is reflected by the low-reflection region.

When the ratio of the area of the contact portion 36b to the area of the upper surface 36a is 1%, 4%, 9%, 16%, 25%, 36%, 49%, 64%, or 81%, the peak appears in the responsivity. When the ratio of the area of the contact portion 36b to the area of the upper surface 36a is increased, the maximum value of the responsivity is reduced, and the radius of the beam spot with which the peak appears is increased. The ratio of the area of the contact portion 36b can be designed by considering such characteristics so that the radius of the beam spot with which the peak appears in the responsivity matches with a desired radius of the beam spot. The ratio of the area of the contact portion 36b to the area of the upper surface 36a shown in FIG. 4 is an example, and the ratio of the area of the contact portion 36b to the area of the upper surface 36a may take other values. As long as the ratio of the area of the contact portion 36b to the area of the upper surface 36a takes a value other than 0% and 100%, the peak appears in the responsivity.

In the back illuminated photo detector 10 according to the first embodiment, the area of the center portion of the contact portion 36b is equal to or smaller than 36% of the area of the upper surface 36a of the semiconductor layers. Specifically, the area of the center portion of the contact portion 36b is about $25\pi$($\mu m^2$), and the area of the upper surface 36a is about $100\pi$ ($\mu m^2$). Thus, the area of the contact portion 36b is about 25% of the area of the upper surface 36a. The area of the contact portion 36b is equal to or smaller than 36% of the area of the upper surface 36a, and hence the peak clearly appears in the responsivity when the radius of the beam spot is changed. It is therefore possible to more easily determine whether or not the radius of the beam spot on the light absorption layer 34 is an appropriate size. Even when the area of the contact portion 36b is larger than 36% of the area of the upper surface 36a, the peak appears in the responsivity as long as the ratio of the area is smaller than 100%. Hence, also in this case, it is possible to determine whether or not the radius of the beam spot on the light absorption layer 34 is an appropriate size.

In the back illuminated photo detector 10 according to the first embodiment, the area of the center portion of the contact portion 36b is equal to or larger than 1% of the area of the upper surface 36a of the semiconductor layers. The p-type electrode 38 and the p-type contact layer 36 are satisfactorily electrically connected to each other with the area of the contact portion 36b being equal to or larger than 1% of the area of the upper surface 36a, with the result that the power consumption of the back illuminated photo detector 10 is sufficiently reduced. Even when the area of the contact portion 36b is smaller than 1% of the area of the upper surface 36a, the peak appears in the responsivity. Hence, also in this case, it is possible to determine whether or not the radius of the beam spot on the light absorption layer 34 is an appropriate size.

As described above, through appropriate adjustment of the size of the contact portion 36b, it is possible to cause the peak in the responsivity to appear with a desired radius of the beam spot. The desired radius of the beam spot is, for example, a radius of the beam spot with which the pile-up does not occur. In a ROSA manufacturing process, the position of the collective lens 11 is adjusted to a position with which the peak is found in the responsivity, and the collective lens 11 is fixed at the responsivity peak position. In this way, satisfactory responsivity and the radius of the beam spot with which no pile-up occurs are achieved. The adjustment time can be greatly reduced and the cost can be cut compared to the back illuminated photo detector having the related-art structure.

Second Embodiment

Figure 5:
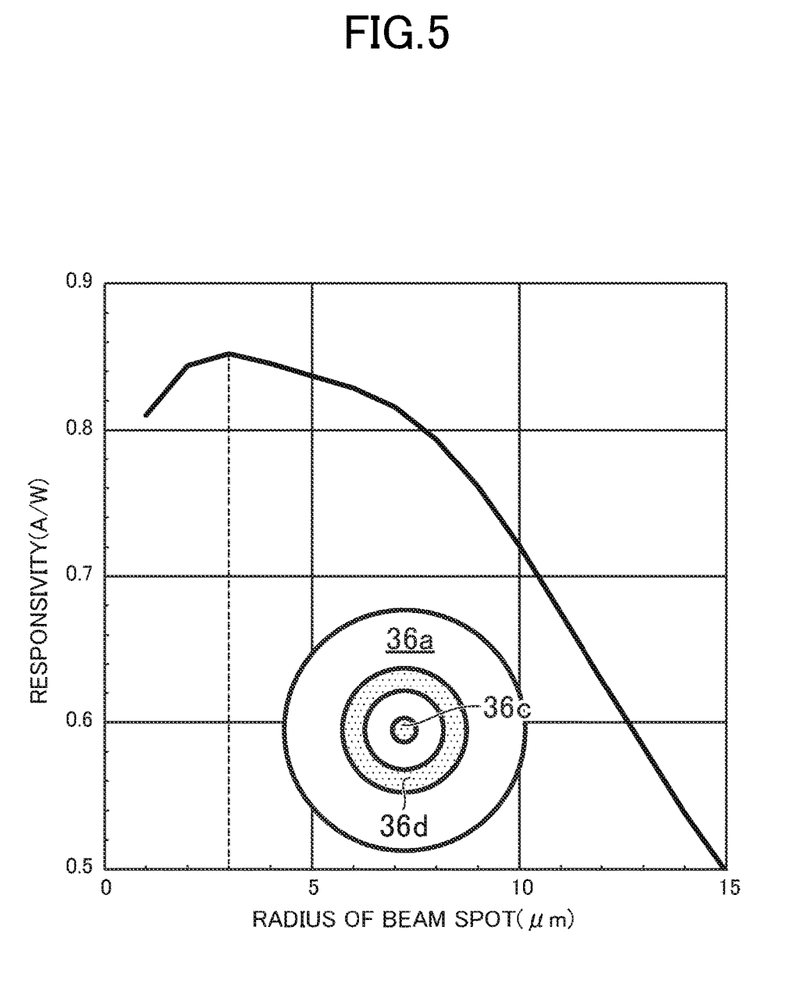
FIG. 5 is a graph for showing the relationship between the responsivity and the radius of a beam spot regarding a back illuminated photo detector according to a second embodiment of the present invention.

FIG. 5 is a graph for showing the relationship between the responsivity and the radius of a beam spot regarding the back illuminated photo detector 10 according to a second embodiment of the present invention. In the graph of FIG. 5, the vertical axis represents the responsivity (unit: A/W), and the horizontal axis represents the radius of a beam spot (unit: µm). In the lower left of the graph, the shape of the upper surface 36a of the semiconductor layers of the back illuminated photo detector 10 according to the second embodiment is outlined, and the shape of a first center portion 36c and the shape of a first peripheral portion 36d are hatched. Contact portions of the back illuminated photo detector 10 according to the second embodiment include the first center portion 36c located on the optical axis of the incident light, and the first peripheral portion 36d surrounding the first center portion 36c while being separated from the first center portion 36c. The passivation film 37 is formed on the upper surface 36a except for the first center portion 36c and the first peripheral portion 36d, and the p-type electrode 38 is formed in the first center portion 36c and the first peripheral portion 36d that are the contact portions. The light reflectance of the p-type electrode 38 is lower than the light reflectance of the passivation film 37. The upper surface 36a except for the first center portion 36c and the first peripheral portion 36d is the high-reflection region, and the first center portion 36c and the first peripheral portion 36d, which are the contact portions, are the low-reflection regions.

When the optical axis of the incident light is adjusted to be positioned on the center of the first center portion 36c, and the radius of the beam spot is reduced to approach zero, most of incident light that is not absorbed by the light absorption layer 34 is reflected by the first center portion 36c, which is the low-reflection region. When the radius of the beam spot is increased in such a state, part of the incident light is reflected by the first center portion 36c, which is the low-reflection region, and the remaining part is reflected by the ring-shaped upper surface 36a, which is the high-reflection region. Further, when the radius of the beam spot is further increased, part of the incident light is reflected by the first center portion 36c, which is the low-reflection region, another part thereof is reflected by the ring-shaped upper surface 36a, which is the high-reflection region, and the remaining part is reflected by the ring-shaped first peripheral portion 36d, which is the low-reflection region. Consequently, the responsivity is gradually increased as the radius of the beam spot is gradually increased from near zero, and the responsivity is then reduced as the radius of the beam spot is further increased. The radius of the beam spot with which the responsivity is maximum is about 3 µm, which is indicated by the broken line in the graph. The responsivity is further reduced as the radius of the beam spot is further increased. As the reason for this, the following is conceivable: when the radius of the beam spot becomes larger than the outer diameter of the upper surface 36a of the semiconductor layers, part of the light does not enter the semiconductor layers and the intensity of the incident light is reduced.

According to the back illuminated photo detector 10 of the second embodiment, because the first center portion 36c and the first peripheral portion 36d are provided, the peak appears in the responsivity when the radius of the beam spot is gradually increased from near zero. As a result, it is possible to recognize that the beam spot has an appropriate radius. Thus, according to the back illuminated photo detector 10 of the second embodiment, it is possible to easily determine whether or not the radius of the beam spot on the light absorption layer 34 is an appropriate size.

Figure 6:
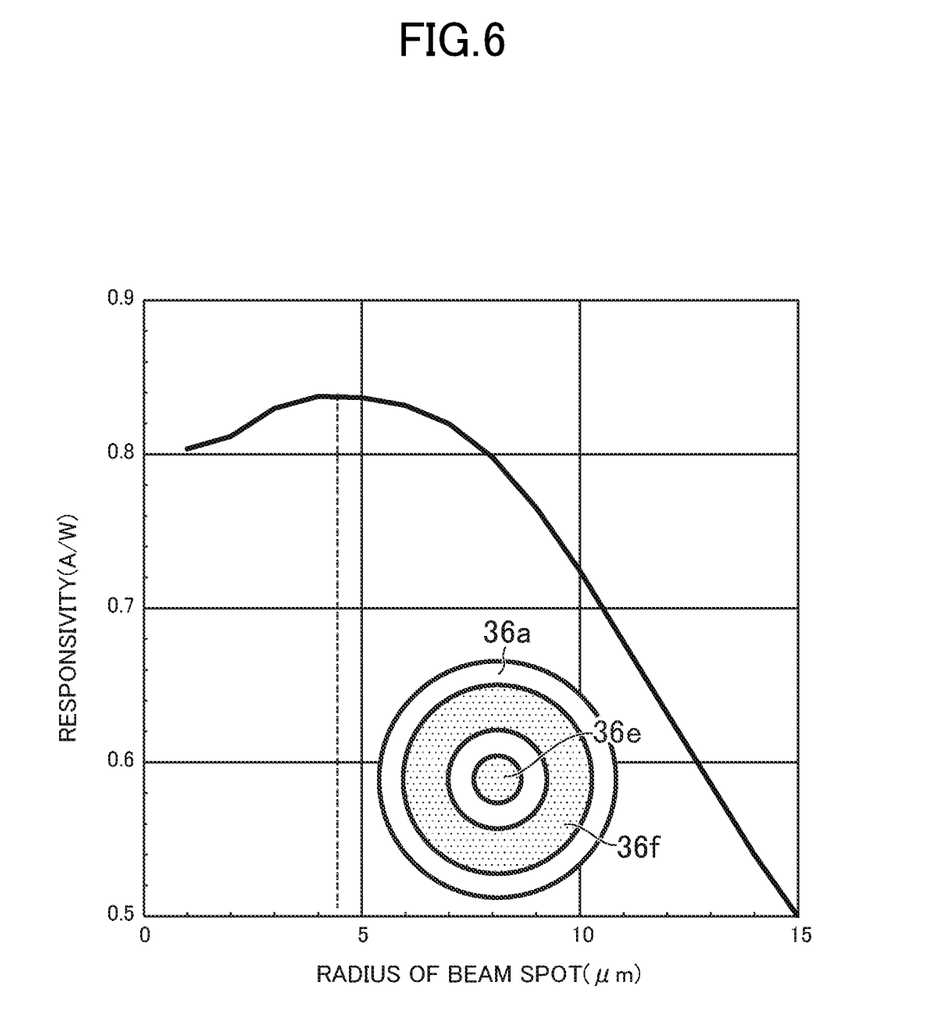
FIG. 6 is a graph for showing the relationship between the responsivity and the radius of a beam spot regarding a back illuminated photo detector according to a first modification example of the second embodiment of the present invention.

FIG. 6 is a graph for showing the relationship between the responsivity and the radius of a beam spot regarding the back illuminated photo detector 10 according to a first modification example of the second embodiment of the present invention. In the graph of FIG. 6, the vertical axis represents the responsivity (unit: A/W), and the horizontal axis represents the radius of a beam spot (unit: µm). In the lower left of the graph, the shape of the upper surface 36a of the semiconductor layers of the back illuminated photo detector 10 according to the first modification example is outlined, and the shape of a second center portion 36e and the shape of a second peripheral portion 36f are hatched.

Contact portions of the back illuminated photo detector 10 according to the first modification example include the second center portion 36e located on the optical axis of the incident light, and the second peripheral portion 36f surrounding the second center portion 36e while being separated from the second center portion 36e. The passivation film 37 is formed on the upper surface 36a except for the second center portion 36e and the second peripheral portion 36f, and the p-type electrode 38 is formed in the second center portion 36e and the second peripheral portion 36f that are the contact portions. The light reflectance of the p-type electrode 38 is lower than the light reflectance of the passivation film 37. The upper surface 36a except for the second center portion 36e and the second peripheral portion 36f is the high-reflection region, and the second center portion 36e and the second peripheral portion 36f, which are the contact portions, are the low-reflection regions. When the contact portions of the first modification example and the contact portions of the back illuminated photo detector 10 according to the second embodiment are compared to each other, the contact portions have in common that the center portion has a substantially circular shape, and the peripheral portion has a ring shape surrounding the center portion. However, the center portion of the first modification example has a radius larger than that of the second embodiment, and the ring of the peripheral portion of the first modification example has a thickness larger than that of the second embodiment.

When the optical axis of the incident light is adjusted to be positioned on the center of the second center portion 36e, and the radius of the beam spot is reduced to approach zero, most of incident light that is not absorbed by the light absorption layer 34 is reflected by the second center portion 36e, which is the low-reflection region. When the radius of the beam spot is increased in such a state, part of the incident light is reflected by the second center portion 36e, which is the low-reflection region, and the remaining part is reflected by the upper surface 36a, which is the high-reflection region. Further, when the radius of the beam spot is further increased, part of the incident light is reflected by the second center portion 36e, which is the low-reflection region, another part thereof is reflected by the ring-shaped upper surface 36a, which is the high-reflection region, and the remaining part is reflected by the ring-shaped second peripheral portion 36f, which is the low-reflection region. Consequently, the responsivity is gradually increased as the radius of the beam spot is gradually increased from near zero, and the responsivity is then reduced as the radius of the beam spot is further increased. The radius of the beam spot with which the responsivity is maximum is about 4 µm, which is indicated by the broken line in the graph. The responsivity is further reduced as the radius of the beam spot is further increased. As the reason for this, the following is conceivable: when the radius of the beam spot becomes larger than the outer diameter of the upper surface 36a of the semiconductor layers, part of the light does not enter the semiconductor layers and the intensity of the incident light is reduced.

According to the back illuminated photo detector 10 of the first modification example, because the second center portion 36e and the second peripheral portion 36f are provided, the peak appears in the responsivity when the radius of the beam spot is gradually increased from near zero. As a result, it is possible to recognize that the beam spot has an appropriate radius. Thus, according to the back illuminated photo detector 10 of the first modification example, it is possible to easily determine whether or not the radius of the beam spot on the light absorption layer 34 is an appropriate size.

Figure 7:
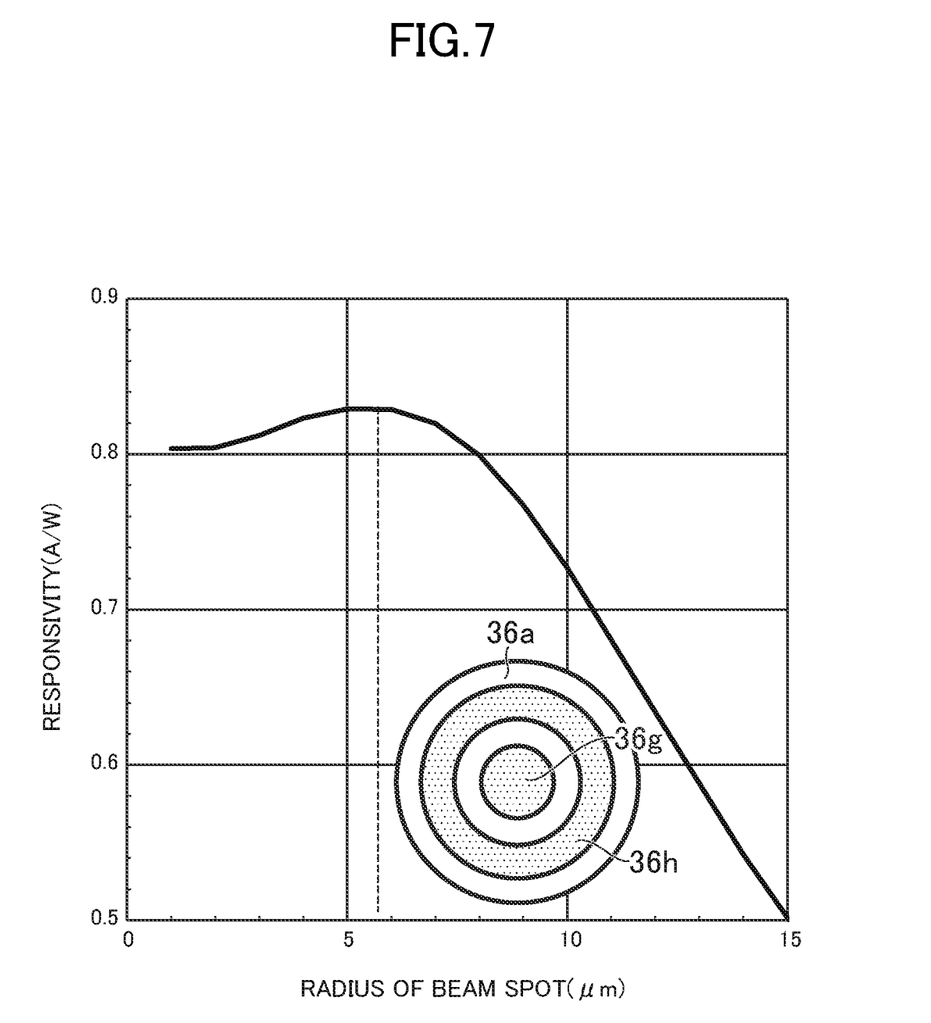
FIG. 7 is a graph for showing the relationship between the responsivity and the radius of a beam spot regarding a back illuminated photo detector according to a second modification example of the second embodiment of the present invention.

FIG. 7 is a graph for showing the relationship between the responsivity and the radius of a beam spot regarding the back illuminated photo detector 10 according to a second modification example of the second embodiment of the present invention. In the graph of FIG. 7, the vertical axis represents the responsivity (unit: A/W), and the horizontal axis represents the radius of a beam spot (unit: μm). In the lower left of the graph, the shape of the upper surface 36a of the semiconductor layers of the back illuminated photo detector 10 according to the second modification example is outlined, and the shape of a third center portion 36g and the shape of a third peripheral portion 36h are hatched. Contact portions of the back illuminated photo detector 10 according to the second modification example include the third center portion 36g located on the optical axis of the incident light, and the third peripheral portion 36h surrounding the third center portion 36g while being separated from the third center portion 36g. The passivation film 37 is formed on the upper surface 36a except for the third center portion 36g and the third peripheral portion 36h, and the p-type electrode 38 is formed in the third center portion 36g and the third peripheral portion 36h that are the contact portions. The light reflectance of the p-type electrode 38 is lower than the light reflectance of the passivation film 37. The upper surface 36a except for the third center portion 36g and the third peripheral portion 36h is the high-reflection region, and the third center portion 36g and the third peripheral portion 36h, which are the contact portions, are the low-reflection regions. When the contact portions of the second modification example and the contact portions of the back illuminated photo detector 10 according to the first modification example of the second embodiment are compared to each other, the contact portions have in common that the center portion has a substantially circular shape, and the peripheral portion has a ring shape surrounding the center portion. However, the center portion of the second modification example has a radius larger than that of the first modification example, and the ring of the peripheral portion of the second modification example has a thickness smaller than that of the first modification example.

When the optical axis of the incident light is adjusted to be positioned on the center of the third center portion 36g, and the radius of the beam spot is reduced to approach zero, most of incident light that is not absorbed by the light absorption layer 34 is reflected by the third center portion 36g, which is the low-reflection region. When the radius of the beam spot is increased in such a state, part of the incident light is reflected by the third center portion 36g, which is the low-reflection region, and the remaining part is reflected by the upper surface 36a, which is the high-reflection region. Further, when the radius of the beam spot is further increased, part of the incident light is reflected by the third center portion 36g, which is the low-reflection region, another part thereof is reflected by the ring-shaped upper surface 36a, which is the high-reflection region, and the remaining part is reflected by the ring-shaped third peripheral portion 36h, which is the low-reflection region. Consequently, the responsivity is gradually increased as the radius of the beam spot is gradually increased from near zero, and the responsivity is then reduced as the radius of the beam spot is further increased. The radius of the beam spot with which the responsivity is maximum is about 6 μm, which is indicated by the broken line in the graph. The responsivity is further reduced as the radius of the beam spot is further increased. As the reason for this, the following is conceivable: when the radius of the beam spot becomes larger than the outer diameter of the upper surface 36a of the semiconductor layers, part of the light does not enter the semiconductor layers and the intensity of the incident light is reduced.

According to the back illuminated photo detector 10 of the second modification example, because the third center portion 36g and the third peripheral portion 36h are provided, the peak appears in the responsivity when the radius of the beam spot is gradually increased from near zero. As a result, it is possible to recognize that the beam spot has an appropriate radius. Thus, according to the back illuminated photo detector 10 of the second modification example, it is possible to easily determine whether or not the radius of the beam spot on the light absorption layer 34 is an appropriate size.

As described in the second embodiment, and the first modification example and the second modification example of the second embodiment, the radius of the beam spot with which the responsivity shows the peak can be changed by appropriately changing the dimensions of the center portion and the peripheral portion of the contact portion. A designer of the back illuminated photo detector 10 may design the shapes and the areas of the center portion and the peripheral portion of the contact portion so that the responsivity may show the peak with a desired radius of the beam spot. Further, as described in the first embodiment and the second embodiment, the radius of the beam spot with which the responsivity shows the peak can be changed by appropriately changing the shape of the contact portion. The designer of the back illuminated photo detector 10 may design the shape of the contact portion so that the responsivity may show the peak with the desired radius of the beam spot.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A back illuminated photo detector, comprising:
    a semiconductor substrate having a first surface for receiving light;
    a semiconductor layer that is laminated on a second surface opposed to the first surface, and comprises a light absorption layer configured to absorb the light;
    a passivation film formed on the semiconductor layer so as to expose a contact portion that is part of an upper surface of the semiconductor layer; and
    an electrode that is in contact with the semiconductor layer in the contact portion, and has a reflectance of the light lower than a reflectance of the light of the passivation film,
    wherein the contact portion at least comprises a center portion located on an optical axis of the light,
    wherein an area of the center portion is smaller than a design cross-sectional area of a beam spot of the light.

2. The back illuminated photo detector according to claim 1, wherein an area of the upper surface of the semiconductor layer is larger than the design cross-sectional area of the beam spot of the light.

3. The back illuminated photo detector according to claim 1, wherein the area of the center portion is equal to or smaller than 36% of an area of the upper surface of the semiconductor layer.

4. The back illuminated photo detector according to claim 1, wherein the area of the center portion is equal to or larger than 1% of an area of the upper surface of the semiconductor layer.

5. The back illuminated photo detector according to claim 1, wherein the contact portion comprises a peripheral portion surrounding the center portion while being separated from the center portion.

6. An optical receiver module, comprising:
the back illuminated photo detector of claim 1;
a collective lens arranged on the first surface side of the back illuminated photo detector; and
a package including the back illuminated photo detector and the collective lens.

* * * * *